United States Patent
Pan et al.

(10) Patent No.: US 11,057,035 B2
(45) Date of Patent: *Jul. 6, 2021

(54) MULTI-VOLTAGE INPUT OUTPUT DEVICE

(71) Applicant: Taiwan Semiconductor Manufacturing Company Limited, Hsinchu (TW)

(72) Inventors: Lei Pan, Shanghai (CN); Zhen Tang, Shanghai (CN); Miranda Ma, Shanghai (CN)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/903,486

(22) Filed: Jun. 17, 2020

(65) Prior Publication Data

US 2020/0313669 A1    Oct. 1, 2020

Related U.S. Application Data

(63) Continuation of application No. 16/705,453, filed on Dec. 6, 2019, now Pat. No. 10,727,831, which is a (Continued)

(30) Foreign Application Priority Data

Sep. 29, 2017  (CN) .......................... 201710909305.8

(51) Int. Cl.
*H03K 17/687* (2006.01)
*H01L 27/092* (2006.01)
*H03K 19/0185* (2006.01)

(52) U.S. Cl.
CPC ....... *H03K 17/687* (2013.01); *H01L 27/0924* (2013.01); *H03K 19/018585* (2013.01)

(58) Field of Classification Search
CPC ............. H03K 17/687; H03K 17/6871; H03K 17/6872; H03K 17/6874
(Continued)

(56) References Cited

U.S. PATENT DOCUMENTS 9,614,529  B1     4/2017  Chen et al.
10,727,831 B2 *   7/2020  Pan ..................... H01L 27/0924
(Continued)

*Primary Examiner* — Tomi Skibinski
(74) *Attorney, Agent, or Firm* — Jones Day

(57) ABSTRACT

A device comprises, a first power source providing a first voltage, a second power source providing a second voltage less than the first voltage, a first bias voltage source providing a first bias voltage between the first voltage and the second voltage, a second bias voltage source providing a second bias voltage between the first voltage and the second voltage, the second bias voltage greater than or equal to the first bias voltage. The device also includes an output, a pull up network coupled in series between the first power source and the output pad including: a first gate coupled to the bias voltage source; and a second gate coupled to a signal that varies between first bias voltage and first power source. The device includes and a pull down network coupled between the output pad and second power source and including: a third gate coupled to the second bias voltage source; and a fourth gate coupled to a signal that varies between the second power source and the second bias voltage source.

20 Claims, 8 Drawing Sheets

Related U.S. Application Data continuation of application No. 15/967,877, filed on May 1, 2018, now Pat. No. 10,511,304.

(58) Field of Classification Search
USPC .... 327/108–112, 427, 434, 437; 326/82, 83, 326/87
See application file for complete search history.

(56) References Cited

U.S. PATENT DOCUMENTS

| | | | |
|---|---|---|---|
| 2010/0271118 A1 | 10/2010 | Bhattacharya et al. | |
| 2014/0097888 A1* | 4/2014 | Lee | H03K 19/018521 327/537 |
| 2014/0266320 A1* | 9/2014 | Conrow | H03K 19/018592 327/108 |
| 2016/0036445 A1* | 2/2016 | Dey | H03K 19/018521 326/81 |

* cited by examiner

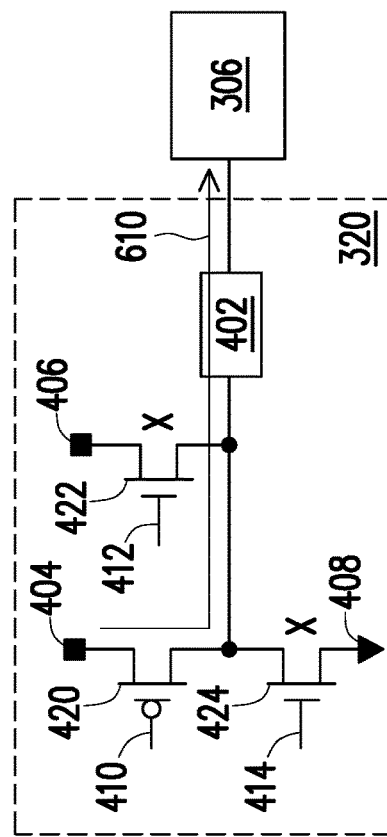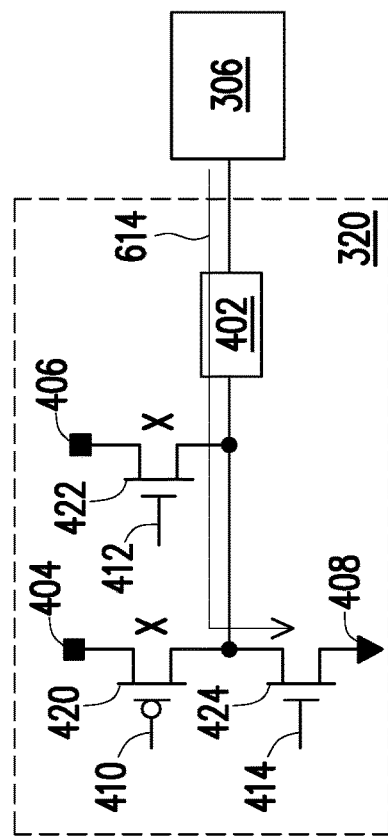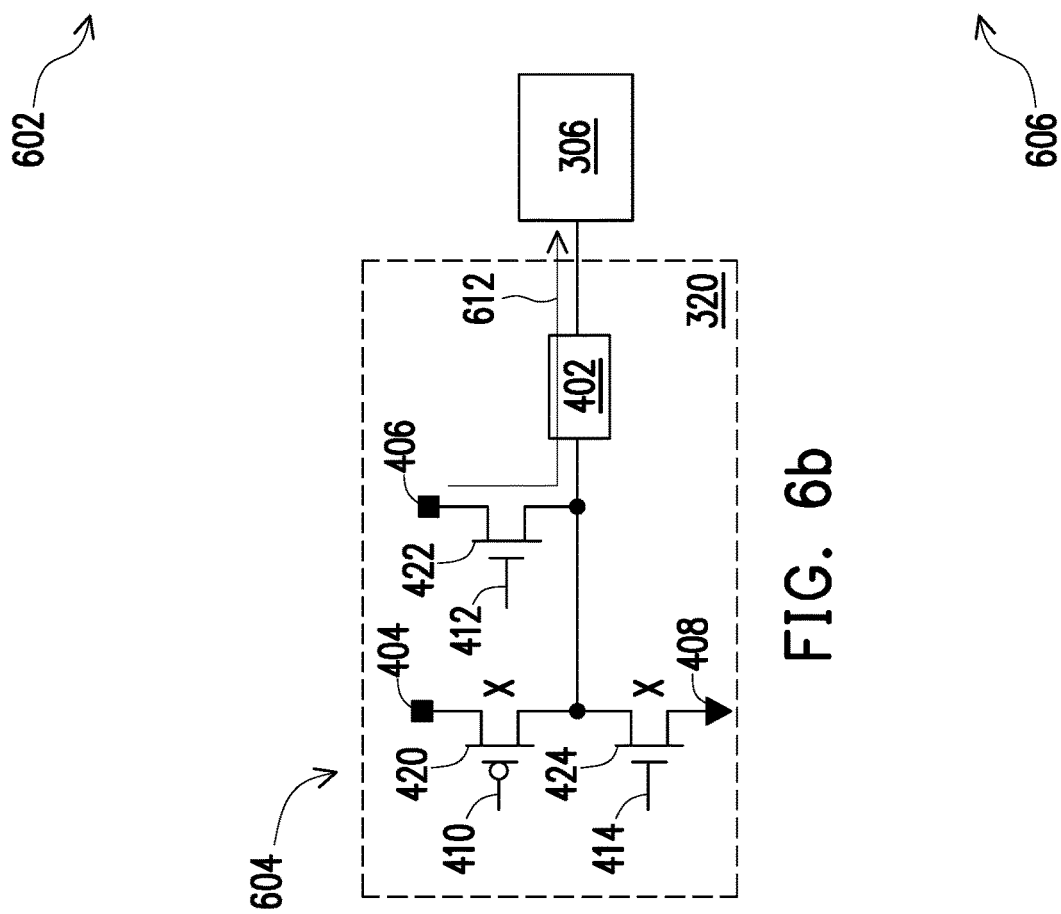

US 11,057,035 B2

MULTI-VOLTAGE INPUT OUTPUT DEVICE

CROSS-REFERENCE TO RELATED APPLICATIONS

This application is a continuation application of U.S. patent application Ser. No. 16/705,453, filed Dec. 6, 2019, which is a continuation application of U.S. patent application Ser. No. 15/967,877, filed May 1, 2018, which claims priority to Chinese Patent Application CN 201710909305.8, filed Sep. 29, 2017, all of which are incorporated herein by reference in their entireties.

FIELD

The technology described in this disclosure relates generally to semiconductor device input/output (I/O) devices.

BACKGROUND

Semiconductor devices may include baseband components for signaling with other electronic devices, and application processors for performing processing functions. Transmission and receive protocols for signaling with other electronic devices impose various electronic characteristics on aspects of a semiconductor device.

BRIEF DESCRIPTION OF THE DRAWINGS

Aspects of the present disclosure are best understood from the following detailed description when read with the accompanying figures. It is noted that, in accordance with the standard practice of the industry, various features are not drawn to scale. In fact, the dimensions of the various features may be arbitrarily increased or reduced for clarity of discussion.

FIG. 6a illustrates aspects of a bias voltage component of a semiconductor device in accordance with various embodiments.

FIG. 6b illustrates aspects of a bias voltage component of a semiconductor device in accordance with various embodiments.

FIG. 6c illustrates aspects of a bias voltage component of a semiconductor device in accordance with various embodiments.

DETAILED DESCRIPTION

Figure 1:
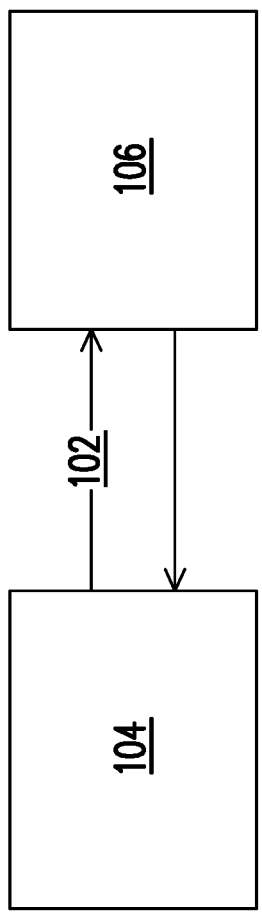
FIG. 1 illustrates a communications circuit in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The present disclosure relates to devices, circuits, structures, and associated methods or processes that are capable of providing a multi-voltage input output device. Generally, certain systems require IO devices or subsystems with IO components. IO devices transmit and receive signals according to one or more protocols, which may be standard protocols or proprietary protocols. Typically a protocol describes among other things the V-I characteristics of a transmitted signal, including voltage constraints that transmitted signal must adhere to. Many modern devices are fabricated to particular dimensions, according to particular process, using particular materials that effectively restrict or limit V-I characteristics of various components of the fabricated device. For example, a semiconductor device, like a finFET transistor formed as part of a transmitter in a host controller may be fabricated to particular dimensions, using particular materials, according to a particular process that limit the operational voltages applied to the transistor. But, in order to comply with one or more protocols, or other design requirements, that transmitter may be required to transmit at voltages that are, or exceed, a voltage (e.g., a gate to source voltage) that will cause damage to the transistor or otherwise impair its reliability. And it is often desirable that such a transmitter be able to selectably operate at different transmit voltages on demand.

In one example of a type of system that requires IO devices, a computer processing system device may include a communications circuit for transmitting and receiving information to and from remotely located computer processing devices. Such devices may include well know computer processors such as desktop computers, servers, laptops, and other general purpose computers. Such devices may also include any consumer or industrial device that comprising computer processing components. In one example, internet-of-things (IoT) devices may include embedded computer processors or system on a chip (SoC) type devices that include processors or integrated processing capability.

In some embodiments a single device or structure may require multiple integrated IO devices to provide signaling between two remote portions of the larger single device or structure. In one such embodiment, a device is a SoC having multiple processors in communications with each other across a transmission path, in which case at least two IO components are employed to facilitate the IO to each of the multiple processors. In another such embodiment, a transmission path may be wireless, or the transmission path may be a wire, a conductor, a line formed as part of semiconductor device forming process, or any other suitable path capable of carrying a signal.

In another example, a SoC may include a sensor component coupled to an A-to-D converter itself coupled to an IO component for carrying a digitized sensed signal to a remote processing device for manipulating the information encoded in the digital signal, and which itself includes an IO component for receiving the digital signal from the sensor component and for transmitting control signals to the sensor component. As used herein, remote is not intended to imply any particular scale of distance between two such IO components, and depending on the application remote may be on the order of nanometers where the transmission path is through a metallization layer in a semiconductor device, or it may be on the order of meters when the transmission path is a wire or wireless. It will be appreciated that a properly constructed transmission path coupled to, e.g., the Internet and employing the proper protocols may be unlimited in length.

The examples of systems and devices that require IO capabilities above are provided by way of example, and are not intended to be limiting. Instead devices in accordance with various embodiments include any electronic device having IO components to facilitate signaling between distinct electronic devices or components across a transmission path.

Signaling between distinct electronic devices or components often is performed, and signaling devices are often designed, in accordance with one or more signaling protocols as discussed above. For example, in a SoC device, having both baseband components and application processors, a host controller component may include an IO device that complies with conventional standards such as: reduced gigabit media-independent interface (RGMII), reduced media-independent interface (RMII), gigabit media-independent interface (GMII), 10 gigabit media-independent interface (XGMII), MultiMediaCard (MMC), Secure Digital (SD), ISO-7816-3, subscriber identify module (SIM), WiFi, and Inter-Integrated Circuit (IIC or I2C, also known as Inter-IC or integrated interface circuit). In embodiments, IO devices are designed to operate at newly developed protocols that differ from standards protocols. For example, within a SoC, two application processors may communicate with each other using an IO component signaling according to the I2C protocol, which is intended to allow multiple digital integrated circuits to communicate with one or more other integrated circuits over short distances within a single device.

In any case, in order to comply with one or more standard protocols, or other design considerations, it is often the case that an IO device has a capability to selectively transmit and receive multiple voltage. In embodiments, IO device can selectively transmission at 1.8 volts, 2.5 volts, or 3.3 volts. In other embodiments, other voltages may be supported, for example 0.3 volts, 0.7 volts, 1 volt, 5 volts, −0.3 volts, −0.7 volts, −1 volt, −1.8 volts, −2.5 volts, −3.3 volts, and −5 volts. It will be appreciated that transmission voltages according to one or more protocols may vary slightly from the intended voltage. For example, a protocol requiring transmission at 3.3 volts may allow for small variances from an ideal, or targeted voltage of 3.3. volts. Such variances will vary according to the intended protocol. Thus, embodiments that selectively transmit at 3.3 volts for example may transmit instead at 3.2 volts or 3.4 volts, or from time to time be subjected to voltage fluctuations so that the transmission voltage varies with respect to a reference voltage by, e.g., +/−0.5 volts. In embodiments, such variances will be dictated by the technology employed in fabricating or manufacturing the devices and one or more design considerations, and it will be appreciated that the exemplary voltages, and their variances from ideal, provided herein are not intended to be limiting. Unless otherwise stated, all voltages stated throughout this application are ideal voltages.

FIG. 1 illustrates aspects of a communications circuit in a system 100 in accordance with various embodiments. System 100 includes a transmission path 102 between a first electronic device 104 and a second electronic device 106. Electronic device 106 is remote from electronic circuit 104, and devices 104 and 106 share information with each other from time to time as needed. In order to share information with each other, each of devices 104 and 106 encode the information in one or more signals that are transmitted across a transmission path to the other device. For example, device 104 may issue control instructions to device 106 by encoding the control instructions in an electronic signal that is transmitted according to a transmission protocol as discussed above. For example, device 104 may encode a digital word in an electronic signal which is transmitted to device 106 across transmission channel 102 according to the I2C protocol. In another example, device 106 is a sensing device and device 104 is a controller that issues a single bit instruction, thereby encoding instructions to either sense (a high voltage) or not sense (a low voltage). The single bit instruction is transmitted to device 106 according to the I2C protocol. In response to a high voltage signal, device 106 may perform an ongoing sensing operation to obtain sensing data which device 106 then encodes and transmits back to device 104 again according to the I2C protocol.

In embodiments, circuit 100 including device 104 and device 106 are each integrated circuits comprising components formed according to particular modern advanced processes and have maximum voltage tolerances that are less than some standard protocols. In embodiments devices 104 and 106 are formed within a larger system, such as an SoC chip embedded within a consumer or industrial device. In other embodiments, device 104 and 106 are separate and distinct integrated circuits communicating across a wireless channel. In other embodiment, device 104 is a host controller embedded in a SoC for transmitting and/or receiving (signaling) across transmission channel 102 to device 106 that is a general purpose computer configured to interact with various components of the SoC, including device 104. In embodiments the maximum voltage tolerances are a result of the process employed to manufacture a particular component. That is, for example, a transistor having a maximum voltage as a result of the process employed means that the transistor has a maximum voltage common to all transistors formed from that same process.

A semiconductor device, such as device 104 may be formed using advanced semiconductor device process. Semiconductor processes refer to the fabrication process used to create an integrated circuit in a semiconductor device. A semiconductor process involves numerous steps applying various techniques, such as photolithography, ion implantation, vapor deposition, or chemical processing, among others, in order to gradually create a circuit components made of semiconductors. A semiconductor fabrication process may be referred to according to the dimensions of device features, e.g. node sizes. Exemplary manufacturing semiconductor process generations may be referred to as 5 nm, 7 nm, 10 nm, 16 nm, 22 nm, 32 nm, 45 nm, 65 nm, 90 nm processes. Each process is a distinct process from a successive generation of technology for creating features of a particular size. In each case, it will be appreciated that various manufacturers have different processes for forming equivalent feature sizes, but may refer to them using different terminology. It will also be appreciated that feature scale may vary in size slightly from the terminology used to refer to the process employed. For example, various manufactures may employ 16 nm nodes may have feature sizes on the order of 16.6 nm, or 18.3 nm. Similarly, various manufactures may employ 10 nm process to obtain exemplary features of 9.5 nm, 11.3 nm, or 12.0 nm. And similarly various manufacturers may employ 7 nm process to obtain exemplary features of 6.7 nm, 8.2 nm, or 8.4 nm. It will be appreciated that semiconductor devices as generally, regardless of their application, are formed according to a specific process.

Regardless of the process employed, it may be the case that semiconductor devices formed of such processes include features that will fail or be destroyed, or otherwise become unreliable, when subjected to voltages exceeding a certain tolerance, e.g. a maximum voltage $V_{MAX}$. When such features of a device are subjected to voltages that exceed $V_{MAX}$, the device may fail, or be damaged or destroyed. But in order to serve as components within products or devices that adhere to certain protocols, a semiconductor devices may be required to handle application of voltages to features of such a device that exceed such a maximum voltage $V_{MAX}$. In some instances $V_{MAX}$ is a function of a material used, or a features size. In some cases $V_{MAX}$ is a function of a manufacturing process $V_{PM}$, i.e. $V_{MAX}=V_{PM}$. In an example, a designer may choose to use a device with a particular 7 nm technology. But because the device may be required to maintain VI characteristics that exceed tolerances imposed upon the device formed by a particular manufactures 7 nm process (e.g. because of a feature size formed by a process or a material used in a process) such a device may fail during operation. Because some devices may be designed to comply with multiple protocols, it is often desirable to be able to selectably support multiple voltage modes one or more of which may exceed such a maximum voltage $V_{MAX}$. In embodiments a maximum voltage imposed upon a device by a manufacturing process utilized is $V_{PM}$, but by applying the techniques described as follows, the device is able to support multiple voltage modes that involve voltages that exceed $V_{PM}$. While discussed in reference to $V_{PM}$, the techniques disclosed herein are also applicable in any semiconductor device that requires application of voltages that exceed a $V_{MAX}$ of a particular device or device feature.

In some embodiments, a device 104 formed of a process-technology has a standard node size of $S_N$ nm. Device 104 includes finFET transistors having a nodes size $S_N$ and maximum operational voltage of $V_{PM}$. That is the maximum gate to source (VGS), the maximum gate to drain voltage (VGD), or the maximum drain to source voltages (VDS) is less than $V_{PM}$. Device 104 is likely to suffer damage if one or more of VGS/VGD/VDS equals or exceeds $V_{PM}$. In order to comply with one or more transmission protocols, device 104 is required to be configurable to selectively transmit at $V_{DD1}$ volts, $V_{DD2}$ volts, or $V_{DD3}$ volts, where $V_{DD1}<V_{PM}<V_{DD2}<V_{DD3}$. It is desirable to be able to switch a transmit voltage of $V_{DD2}$ volts, or $V_{DD3}$ volts onto an output path using the same circuitry as employed for switching $V_{DD1}$ volts onto the output path without exceeding the maximum VDS/VGS/VDG voltage, e.g. $V_{PM}$, of the devices transistors. In embodiments, where $V_{DD1}$, $V_{DD2}$, $V_{DD3}$, $V_{PM}$ are treated as nominal voltages, may vary between 0.9-1.1 of such a nominal voltage. In other embodiments, where $V_{DD1}$, $V_{DD2}$, $V_{DD3}$, $V_{PM}$ are treated as nominal voltages, may vary between 0.95-1.05 of such a nominal voltage. In some embodiments, $V_{DD1}$ is a nominal voltage, while a true voltage may vary between $0.9*V_{DD1}$-$1.1V_{DD1}$, while $V_{DD2}$ and $V_{DD3}$ are also nominal voltages, while their respective true voltages vary respectively between $0.95*V_{DD2}$-$1.05*V_{DD2}$ and $0.95*V_{DD3}$-$1.05*V_{DD3}$.

Figure 2:
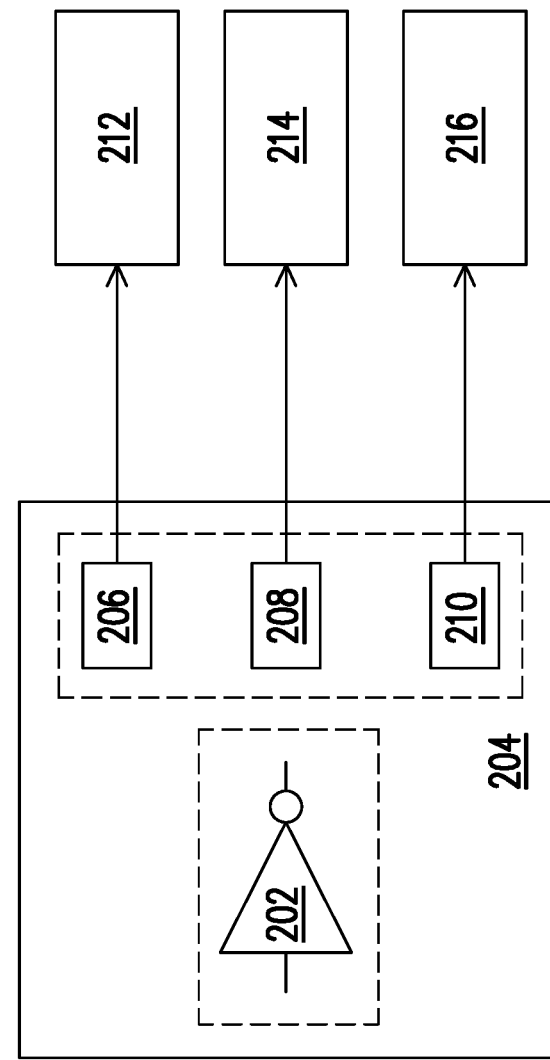
FIG. 2 illustrates aspects of a signaling component of a semiconductor device in accordance with various embodiments.

FIG. 2 illustrates an exemplary transmission system 200 in accordance with various embodiments. Semiconductor device host controller 204 is configurable in order to selectively transmit to devices 212, 214 or 216. In this exemplary transmission system 200, device 212 operates according to a protocol such that it expects to receive a signal having a nominal high voltage of 1.8 volts (which in some embodiments may in practice vary between 1.71V and 1.89V, or in other embodiments may vary between 1.62V and 1.98V) and a low voltage of $V_{SS}=0$ volts. Device 214 operates according to a protocol such that it expects to receive a signal having a nominal high voltage of 2.5 volts (which in some embodiments may in practice vary between 2.37V and 2.63V, or in other embodiments may vary between 2.25V and 2.75V) and a low voltage of 0 volts. Device 216 operates according to a protocol such that it expects to receive a signal having a nominal high voltage of 3.3 volts (which in some embodiments may in practice vary between 3.14V and 3.47V, or in other embodiments may vary between 2.97V and 3.63V) and a low voltage of 0 volts. In some embodiments, a nominal 1.8V corresponds to a true voltage that varies between 1.62V and 1.98V, and a nominal 2.5V corresponds to a true voltage that varies between 2.37V and 2.63V, and a nominal 3.3V corresponds to a true voltage that varies between 3.14V and 3.47V.

Host controller 204 includes one or more buffers, such as buffer 202, for buffering an input signal from a larger device into which host controller 204 is embedded, e.g. device 104. Buffer 202 then provides the buffered signal to a transmission circuit of one of three configurations, e.g. configuration 206 for transmitting at 1.8 volts to device 212, configuration 208 for transmitting at 2.5 volts to device 214, or configuration 210 for transmitting to device 216. It will be appreciated that transmission circuit configurations 208, 210, or 212 may be three distinct transmission circuits in three distinct configurations, or alternatively (as with the system described in reference to FIG. 3), transmission circuit configurations 208, 210, or 212 may be three distinct configurations of a single transmissions circuit (e.g. 310) capable of being selectively configured (e.g. according to one or more control signals) to output a desired transmit voltage. In an embodiment, each of 206, 208, 210 is a statically configured embodiment of a transmitter capable selectably transmitting one of a multiple of nominal voltages.

Figure 3:
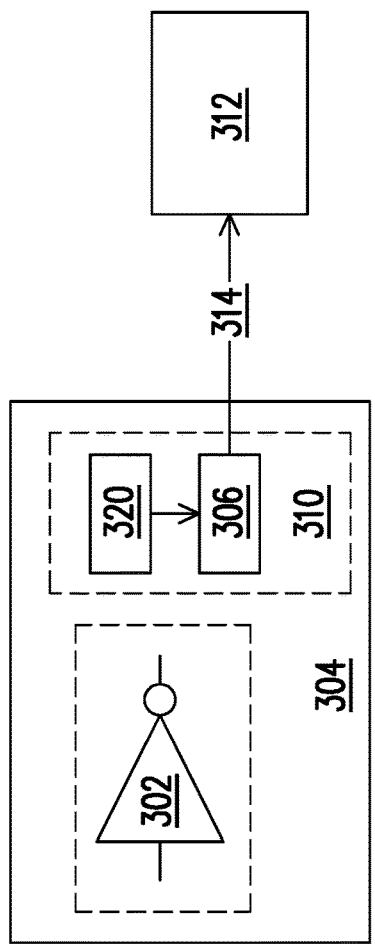
FIG. 3 illustrates aspects of a signaling component of a semiconductor device in accordance with various embodiments.

FIG. 3 illustrates an exemplary transmission system 300 in accordance with various embodiments having a single configurable transmitter 310 capable of selectably operating in multiple configurations. Device 300 illustrates an embodiment capable of selectively transmitting at multiple voltages to device 312. Transmission circuit 304 may, like semiconductor device host controller 204, include one or more buffers, e.g., buffer 302. The configurable transmitter 310 of transmission circuit 304 further includes a configurable transmission output circuit 306 with configurable bias voltage generation circuit 320. In embodiments, transmission circuit 304 is capable of selectively transmitting any of 1V, 2V or 3V (in each case nominal voltages) to device 312. Transmission output circuit 306 comprises one or more transistors for converting data from buffer 302 into an output signal on output path 314 according to a protocol expected by device 312. The gate transistors of transmission output circuit 306 have a maximum VDS, VGS, or VDG rated at 1. $V_{MAX}$=1.1 volts (the upper limit of a nominal 1V signal), which if exceeded may damage, destroy, or otherwise render transmission circuit 304 unreliable. Thus, to prevent subjecting gate transistors of transmission output circuit 306 to a voltage in excess of their maximum rated VDS, VGS, or VDG voltage, a bias voltage is generated, as explained further below in reference to FIGS. 4 and 6, with bias voltage generation circuit 320 and the bias voltage $V_{Bias}$ is applied to a gate of a transistor of the transmission output circuit 306, as explained in reference to FIGS. 5, 7-10. In embodiments, the output path 314 includes the signal path to device 312 as well as the signal path through components of 306 to a power supply (i.e. inclusive of the signal path through 306 and an external path to device 312).

In other embodiments, a circuit may include multiple configurable transmitters 310, each statically configured to provide a particular one of the selectable voltage modes of configurable transmitter 310. In other embodiments, transmission circuit 304 is capable of selectably transmitting in three voltages modes, and the devices comprising circuit 304 have a $V_{MAX}$=1.98V, the upper limit a nominal voltage $V_{DD1}$=1.8V. In a first mode transmitter 310 transmits at a nominal voltage $V_{DD1}$=1.8V, in a second mode transmitter 310 transmits at a nominal voltage $V_{DD2}$=2.5V, and in a third mode transmitter 310 transmits at a nominal $V_{DD3}$=3.3V. In other embodiments, transmission circuit 204 includes three independent statically configured transmitters 310 that may be selectably enabled by circuit 204, e.g. transmitter 206 includes a transmitter 310 statically configured to transmit $V_{DD1}$=1.8V, transmitter 208 includes a transmitter 310 statically configured to transmit $V_{DD2}$=2.5V, and transmitter 210 includes a transmitter 310 statically configured to transmit $V_{DD2}$=3.3V, and the devices comprising circuit 204 have a $V_{MAX}$=1.98V.

Figure 4B:
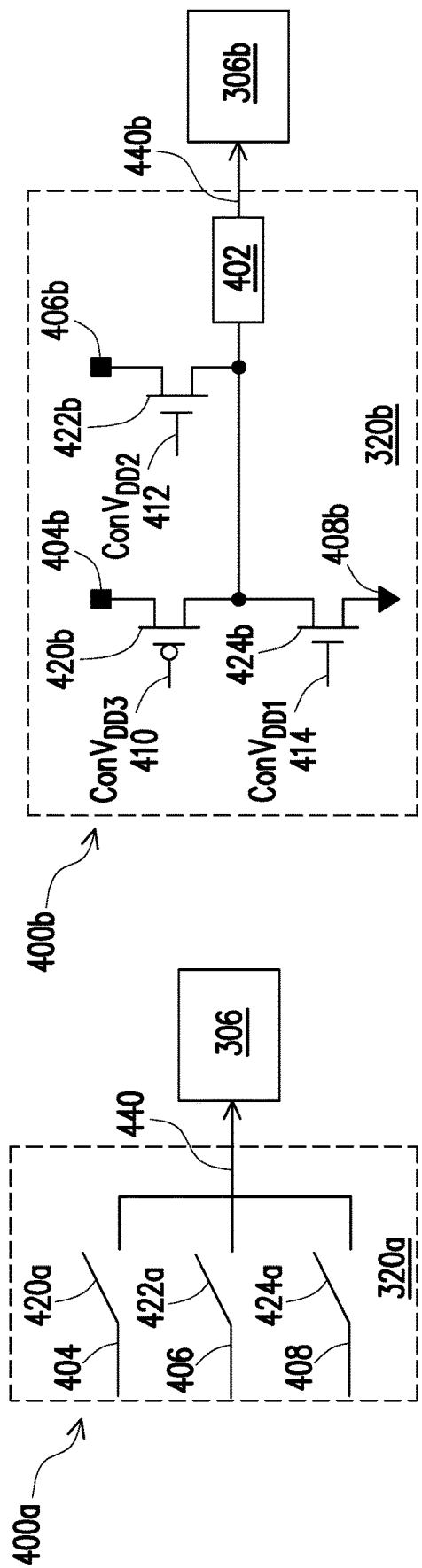
FIG. 4b illustrates aspects of a bias voltage component of a semiconductor device in accordance with various embodiments.
Figure 4A:
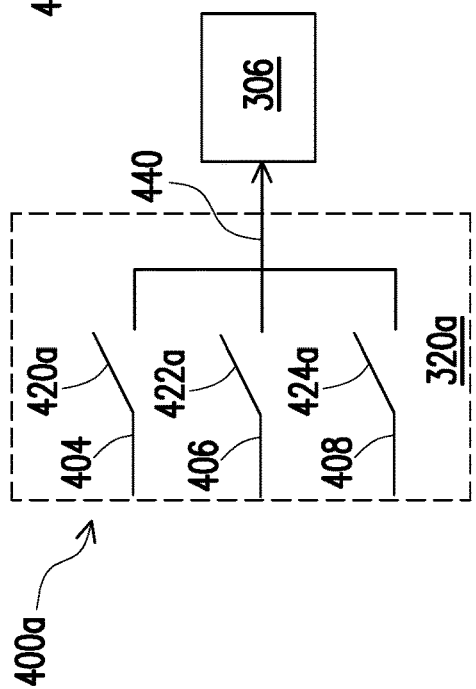
FIG. 4a illustrates aspects of a bias voltage component of a semiconductor device in accordance with various embodiments.

FIG. 4a illustrates an exemplary bias voltage circuit 400a including various embodiments of bias voltage generation circuit 320a. In circuit 400a, bias voltage generation circuit 320a generates a bias voltage, which is applied to transmission output circuit 306 by closing one of switch 420a, 422a, or 424a. Bias circuit 400a includes embodiments of bias voltage generation circuit 320a comprising a first switch 420, a second switch 422, and a third switch 424 for respectively providing a first voltage $V_{DD3}$ 404, a second voltage $V_{DD2}$ 406, or a third voltage $V_{DD1}$ 408 as a bias voltage $V_{Bias}$ 440 to output transmission circuit 306. In embodiments, the $V_{DD3}$ 404 is 2V, $V_{DD2}$ 406 is 1V, and $V_{DD1}$ 408 is 0V, and $V_{MAX}$=1.1. In embodiments, when transmission circuit 306 is configured to transmit 3V, one or more control signals (not particularly illustrated here) operate under control of control logic (not particularly illustrated here) to close switch 420a, and open switches 422a, 424a, in order to provide $V_{DD3}$ 404, 2 volts, as bias voltage $V_{Bias}$ 440 to transmission output circuit 306. And when transmission circuit 306 is configured to transmit 2 volts, one or more control signals (not particularly illustrated here) operate under control of control logic (not particularly illustrated here) to close switch 422a, and open switches 420a, 424a, in order to provide $V_{DD2}$ 406, 1 volt, as bias voltage $V_{Bias}$ 440 to transmission output circuit 306. And when transmission circuit 306 is configured to transmit 1 volt, one or more control signals (not particularly illustrated here) operate under control of control logic (not particularly illustrated here) to close switch 424a, and open switches 420a, 422a, in order to provide $V_{DD1}$ 408, 0 volt, as bias voltage $V_{Bias}$ 440 to transmission output circuit 306.

FIG. 4b illustrates another exemplary bias voltage circuit 400b including various embodiments of bias voltage generation circuit 320b. Bias voltage generation circuit 320b comprising a first transistor 420b, a second transistor 422b, and a third transistor 424b for respectively providing a first voltage 404b, a second voltage 406b, or a third voltage 408b as a bias voltage $V_{Bias}$ 440b to output transmission circuit 306b via pad 402. In circuit 400b, bias voltage generation circuit 320b generates a bias voltage $V_{Bias}$, which may be the first voltage $V_{DD3}$ 404b, the second voltage $V_{DD2}$ 406b or the third voltage $V_{DD3}$ 408b. The bias voltage generation circuit 320b provides the bias voltage $V_{Bias}$ to transmission output circuit 306b, via output pad 402, depending on a transmit voltage expected by device 306b. which may be 0.8 volts, 1.8 volts or 3.3 volts (e.g. as dictated by an applicable signaling protocol). While circuit 400b is illustrated to reflect three bias voltages, it will be appreciated that any number of suitable bias voltages may be selectably coupled to pad 402 as required by design considerations.

In embodiments of bias voltage circuit 400b, $V_{DD3}$ 404b is 1.8 volts, $V_{DD2}$ 406b is 0.8 volt, and $V_{DD1}$ 408b is 0 volts (in each case nominal voltages). $V_{DD3}$ 404b may also be referred to as a highest bias voltage ($V_{Hbias}$). Components of transmission circuit 306b are limited by $V_{MAX}$=1.98V (i.e. the upper limit of $V_{DD3}$, in embodiments 1.1*$V_{DD3}$). Control lines 410, 412, and 414 are respectively coupled to the gates of transistors 420b, 422b, 424b, and carry signals for turning on and off gate transistors 420b, 422b, and 424b according to a voltage mode of transmission circuit 306b, thereby selectively providing one of voltages 404b, 406b, or 408b to transmission output circuit 306b as a bias voltage 440b. Thus, when transmission circuit 306b is configured to transmit 3.3 volts, control signal 410 (Con $V_{DD3}$) is pulled low, control signal 412 (Con $V_{DD3}$) is pulled low and control signal 414 (Con $V_{DD1}$) is pulled low in order to turn on PMOS transistor 420b, while turning off transistors 422b, 424b, in order to provide voltage 404b, 1.8 volts, to output pad 402 in order to provide 1.8 volts as bias voltage 440b to transmission output circuit 306b. And, when transmission circuit 306b is configured to transmit 2.5 volts, control signal 410 (Con $V_{DD3}$) is pulled high, control signal 412 (Con $V_{DD2}$) is pulled high and control signal 414 (Con $V_{DD1}$) is pulled low in order to turn on NMOS transistor 422b, while turning off transistors 420b, 424b, in order to provide voltage 406b, 0.8 volts, to output pad 402 in order to provide 0.8 volts as bias voltage 440b to transmission output circuit 306b. And, when transmission circuit 306b is configured to transmit 1.8 volts, control signal 410 (Con $V_{DD3}$) is pulled high, control signal 412 (Con $V_{DD2}$) is pulled low and control signal 414 (Con $V_{DD1}$) is pulled high in order to turn on NMOS transistor 424b, while turning off transistors 420b, 422b, in order to provide voltage 408b, 0 volts, to output pad 402 in order to provide 0 volts as bias voltage 440b to transmission output circuit 306b. Table 1, below, describes a truth table describing the logic states of Con $V_{DD3}$ 410, Con $V_{DD2}$ 412, and Con $V_{DD1}$ 414, and the states of $V_{Bias}$ 440b, and operational mode of transmission output circuit 306b.

TABLE 1

| State | Con$V_{DD3}$ 410 | Con$V_{DD2}$ 412 | Con$V_{DD1}$ 414 | Vbias 440b | operational voltage mode of 306b |
|---|---|---|---|---|---|
| 602 | 1 | 0 | 1 | 0 | 1.8 V mode |
| 604 | 1 | 1 | 0 | 0.8 V | 2.5 V mode |
| 606 | 0 | 0 | 0 | 1.8 V | 3.3 V mode |

Figure 5B:
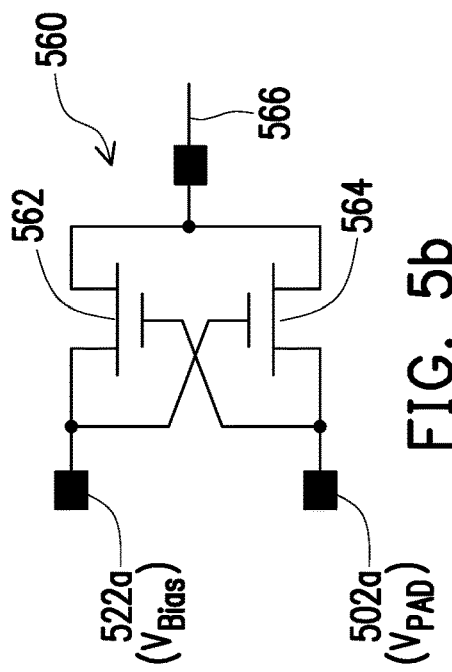
FIG. 5b illustrates an NMOS post driver tracking circuit.
Figure 5C:
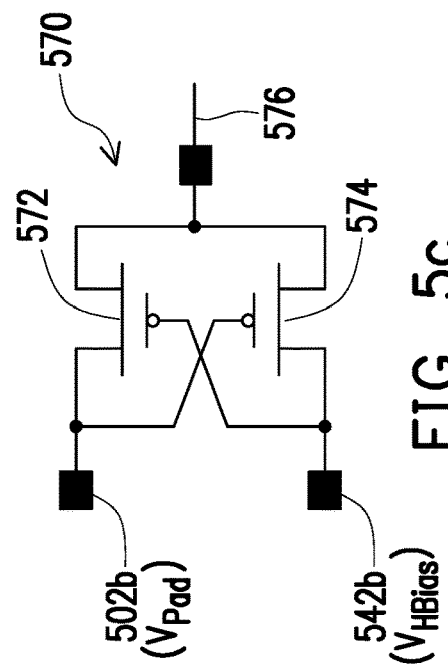
FIG. 5c illustrates a PMOS post driver tracking circuit.
Figure 5A:
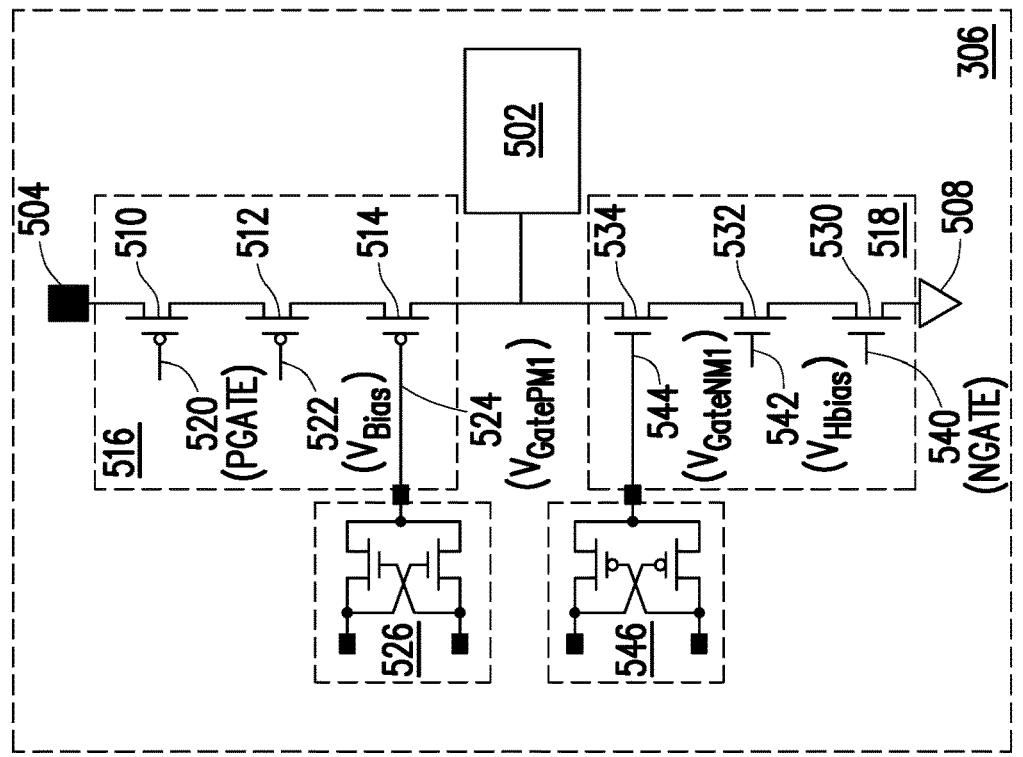
FIG. 5a illustrates aspects of a three stage signaling component of a semiconductor device in accordance with various embodiments.

FIG. 5a illustrates various aspects of an exemplary transmission output circuit 500 for providing a transmission signal to output pad 502. In embodiments, output pad 502 is coupled to an output path. In other embodiments output pad 502 is coupled to an antenna for wireless transmission, in other embodiments output pad 502 is coupled to a metal line within a SoC, or a wire coupled to a remote device, e.g. device 106, 212, 214, 216 or 312. The embodiments illustrated in FIG. 5 are of a type referred to as a 3-cascade design and are configured to eliminate reliability issues arising when using transistors in an overdrive fashion (e.g., where an applied voltage exceeds a maximum voltage, $V_{MAX}$ of a transistor, e.g. a $VDS_{max}$, $VGS_{max}$, or $VDG_{max}$). For example, the embodiments of FIG. 5 may be configured to eliminate reliability issues, or damage, to nominal 1.8 volt devices (i.e. $V_{MAX}$=1.98V) when operating at 3.3 volts or 2.5 volts. A dynamically created "middle voltage", or bias voltage is applied in order to support multi-voltage operation having voltage modes of nominal 1.8 volts or 2.5 volts or 3.3. volts without any of the device transistors being at risk of failure, damage, or of experiencing reliability issues caused by applied voltages exceeding a $V_{MAX}$.

Transmission output circuit 500 includes a pull up transistor network 516 including a first PMOS 510, a second PMOS 512, and a third PMOS 513, each coupled, source to drain, in series with each other, and in series between a transmit high supply voltage 504 and an output pad 502. Transmission output circuit 500 also includes a pull down transistor network 518 including a first NMOS 530, a second NMOS 532, and a third NMOS 534, each coupled, source to drain, in series with each other, and in series between a transmit low supply voltage 508 and an output pad 502. In embodiments, output high voltage 504 is selectively supplied at nominal 1.8 volts, 2.5 volts, and 3.3 volts depending on the transmission protocol circuit 500 is applying. In embodiments, output low voltage 508 is supplied at 0 volts, but may in other embodiments differ depending on the transmission protocol circuit 500 is applying. In embodiments, each of first PMOS 510, second PMOS 512, third PMOS 513, first NMOS 530, second NMOS 532, and third NMOS 534 has a maximum $V_{GS}$ of 1.98V.

When output transmission circuit is in operation, a signal PGATE is supplied to, and carried by, line 520, thereby turning first PMOS 510 on or off based on the state of PGATE, the signal carried on line 520. Signal PGATE causes the voltage on line 520 to vary between $V_{Bias}$ (e.g. as provided or generated by a bias voltage circuit such as 320, 400a, or 400b) and the transmit high supply voltage 504. Signal $V_{Bias}$ is provided to, and carried by, line 522 thereby constantly applying $V_{Bias}$ to the gate of PMOS 512. And, line 524 is coupled to tracking circuit 526. Tracking circuit 526 is configured (as discussed further below in reference to FIG. 5b to maintain a voltage ($V_{GatePMI}$), in a range between a voltage appearing at the output pad 502 ($V_{PAD}$) and $V_{Bias}$, on gate line 524 at the gate of PMOS 514. Thus, when PGATE is high on line 520 (at the transmit high supply voltage 504), PMOS 510 is off, and the VGS voltage of PMOS 510 is approximately zero. When PGATE is low on line 520 (i.e. $V_{Bias}$) the maximum gate to source voltage of PMOS 510 is less than a difference between a transmit high supply voltage 504 and the bias voltage $V_{Bias}$.

FIG. 5b illustrates embodiments of a tracking circuit 560. Tracking circuit 526 may include tracking circuit 560. Tracking circuit 560 includes two input lines 522a and 502a and an output line 566 which is maintained between voltages appearing at its inputs 522a and 502a. In embodiments tracking circuit 560 is a post-driver for a PMOS, input line 522a carries $V_{Bias}$, and input line 502a carries $V_{Pad}$. When $V_{Pad}$ carries transmit high voltage (because transmit high voltage is always higher than $V_{Bias}$) NMOS1 562 is on and NMOS2 564 is off, thus output line 566 takes $V_{Bias}$. If $V_{Pad}$ takes a transmit low voltage, e.g. 508 (because transmit low voltage is always lower than $V_{Bias}$) NMOS1 562 is off and NMOS2 is on, and output line 566 takes $V_{Pad}$ (transmit low voltage). Thus, line 566 carries a signal that swings between $V_{Bias}$ and $V_{Pad}$.

For example, if $V_{MAX}$ is 1.98V, and if transmit high supply voltage is configured to supply nominal 3.3V, and a bias voltage generation circuit provides a bias voltage $V_{Bias}$ of nominal 1.8 volts, the gate to source voltage (VGS) of PMOS 510 is nominally 1.5V (which if $V_{Bias}$ has a minimal value of 1.62V (i.e. 1.8V*0.8), and transmit high supply voltage varies high to its maximum 3.47V (i.e. 3.3V*1.05), the VGS for PMOS 510 is a maximum of 1.85V, less than $V_{MAX}$=1.98V). Thus, in cases where PMOS 510 is formed from a semiconductor process technology with a maximum VGS voltage of 1.98V there is no risk of failure. When PMOS 510 is on, PMOS 512, 514 are also on, as the bias voltage $V_{BIAS}$ also appears on line 522, turning PMOS 512 on as the transmit high voltage appears in the output path, and similarly PMOS 514 is on as line 524 also receives $V_{Bias}$ (as describe in reference to FIG. 5b). And if PMOS 510, 512, 514 have a $VGS_{MAX}$=1.98V and there is substantially less risk of failure or reliability issues caused by exceeding $VGS_{MAX}$ of any of PMOS transistors 510, 512, 514.

When output transmission circuit is in operation, a signal NGATE is supplied to line 540, thereby turning first NMOS 530 on or off based on the state of NGATE. In embodiments, the logic high and logic low states of NGATE are complementary to the logic high and logic low states of PGATE, while the voltages of the logic states differ for NGATE and PGATE. In embodiments, when PGATE is high, e.g. 3.3 volts, NGATE is low, e.g. 0 volts, and when PGATE is logic low, e.g. 1.8 volts, NGATE is logic high, e.g. 1.8 volts. When PGATE is low and PMOS 510 is on, each channel of PMOS 510, 512, 514 is conducting creating an output path from 504 to output pad 502 and to the external transmission output path to the receiving device. When NGATE is high and NMOS 530 is on, each channel of NMOS 530, 532, 534 is conducting (as explained below) creating an output path from 508 to output pad 502 and to the external transmission output path to the receiving device.

Signal NGATE causes the voltage on line 540 to vary between a highest bias voltage (VHbias) (e.g. which may be a highest voltage, such as voltage $V_{DD3}$ 404b, generated by a bias voltage circuit, such as 400b, in accordance various embodiments thereof) and the transmit low supply voltage 508 (e.g. VSS=0V). VHbias is provided to line 542 thereby applying VHbias to the gate of NMOS 532 (in this way VHbias also serves as a second bias voltage). And, line 544 is coupled to tracking circuit 546, which behaves as described below in reference to FIG. 5c. Tracking circuit 546 is configured to maintain a voltage, between a voltage appearing at the output pad 502 and VHbias, on gate line 544 at the gate of NMOS 534. Thus, when NGATE is logic low (at the transmit low supply voltage 508), NMOS 530 is off.

FIG. 5c illustrates embodiments of a tracking circuit 570. Tracking circuit 546 may include tracking circuit 570. Tracking circuit 570 includes two input lines 502b and 542b and an output line 576 which is maintained between voltages appearing at its inputs 502b and 542b. In embodiments tracking circuit 570 is a post-driver for a PMOS gate, input line 502b carries $V_{Pad}$, and input line 542b carries $V_{HBias}$. When $V_{Pad}$ carries transmit high voltage (because transmit high voltage is always higher than $V_{Bias}$) PMOS1 572 is on and PMOS2 574 is off, thus output line 576 takes $V_{Pad}$. If $V_{Pad}$ takes a transmit low voltage, e.g. 508 (because transmit low voltage is always lower than $V_{HBias}$) PMOS1 572 is off and PMOS2 574 is on, and output line 576 takes $V_{HBias}$. Thus, line 576 carries a signal that swings between $V_{HBias}$ and $V_{Pad}$.

For example, if transmit low supply voltage is configured to supply 0V, and a highest bias voltage generation circuit provides a highest bias voltage, VHbias, of 1.8V nominal, the gate to source voltage of NMOS 530 is 1.8V and NMOS 530 is on, pulling the output path low. If NMOS 530 has a $V_{MAX}$ of 1.98 v, there is no risk of failure or reliability issues. When NMOS 530 is on, NMOS 532, 534 are also on, as the highest bias voltage (VHbias) appears on line 522, as a logic high to the source voltage pulled low, turning NMOS 532 on as the transmit low voltage appears in the output path, and similarly NMOS 534 is on as line 544 receives $V_{HBias}$ as described in reference to FIG. 5c. And if NMOS 530, 532, 534 have a $V_{MAX}$ of 1.98 v, there is substantially less risk of failure or reliability issues.

Table 2 below describes voltages appearing in circuit 500 comprising components with $V_{MAX}$=1.98V in embodiments configured for transmit high voltage is 3.3V and transmit low voltage of 0.0V, $V_{HBias}$=1.8V and $V_{Bias}$=1.8V. As shown, all gate to source and drain to source voltages are less than a $V_{MAX}$=1.98V. In Table 2, values for two conditions are shown. In the first row of values in $V_{Pad}$ on pad 502 is 3.3V indicating that circuit 500 is configured to transmit high voltage (3.3V). In the second row of values $V_{Pad}$ on pad 502 is 0V indicating circuit 500 is configured to transmit low voltage (0V). As shown, when transmitting high (first row of values beginning with pad 502 at 3.3V) each PMOS in transmit path between 504 and 502 is on, and VDS is 0V, and each of the NMOS is either on (534 (NM1)), partially on (532 (NM2)) or off (530 (NM3)). And when transmitting low (second row of values beginning with pad 502 at 0V) each NMOS in transmit path between 508 and 502 is on, and each of the PMOS is likewise either off, partially on, or on.

transmission circuit 500, bias current paths 610, 612, 614 are provided to PMOS 512, tracker circuit 526, and a PGATE circuit for providing a low logic level in the PGATE signal appearing at PMOS 510. In each case, VHbias 404 is provided to NMOS 532, and tracker circuit 546, and an NGATE circuit for providing a high logic level in the NGATE signal appearing at NMOS 530.

Figure 7:
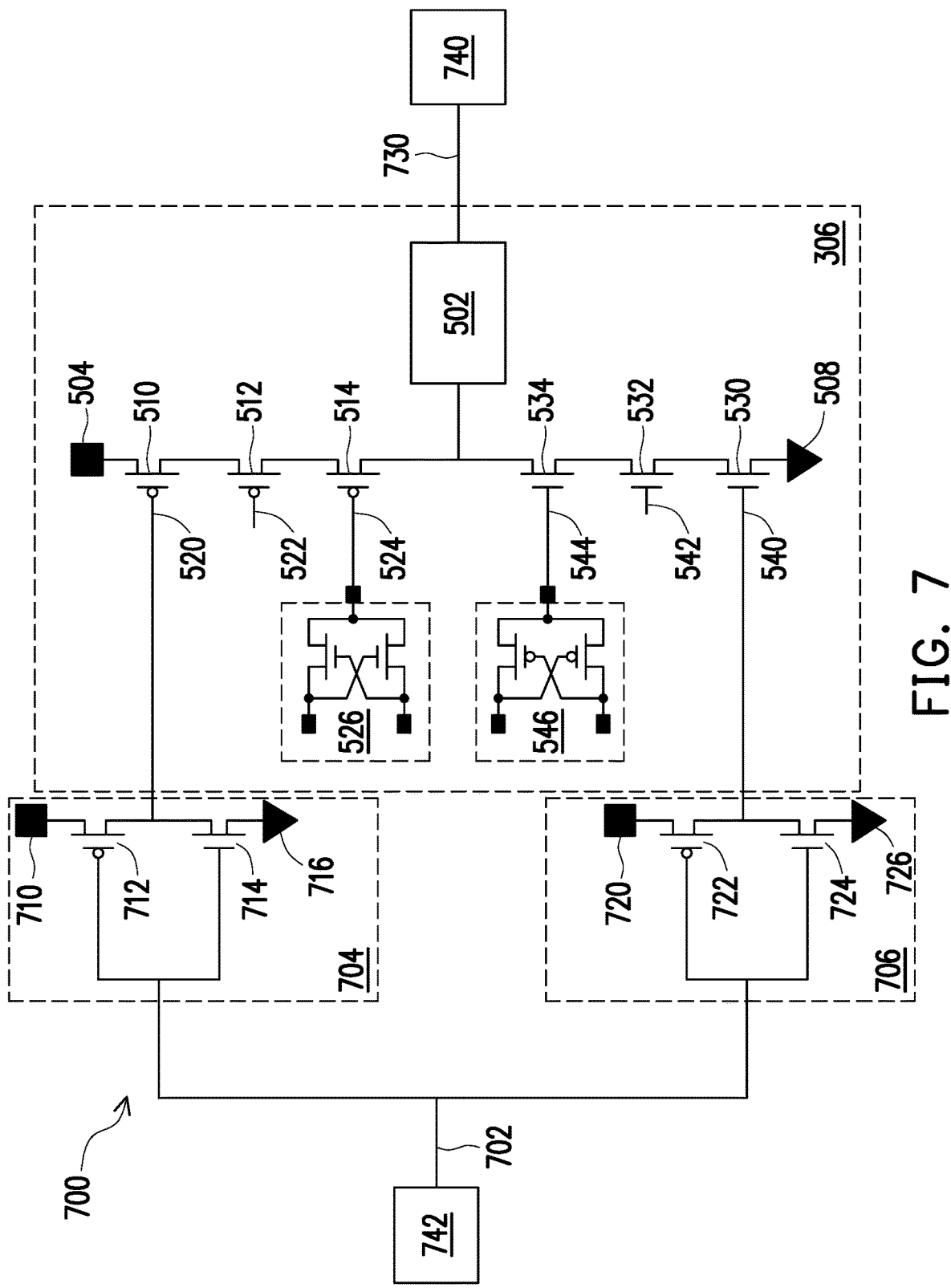
FIG. 7 illustrates aspects of a three stage signaling component of a semiconductor device in accordance with various embodiments.

FIG. 7 illustrates embodiments of a transmission output circuit 700 including transmission output circuit 500 for transmitting along output path 730 to device 740. Transmission output circuit 700 also includes an exemplary PGATE circuit 704 and an exemplary NGATE circuit 706 for respectively generating PGATE and NGATE. PGATE and NGATE are respectively providing to lines 520, as PGATE for controlling a state of PMOS 510, and 540, as NGATE for controlling a state of NMOS 530.

PGATE circuit 704, by way of example, includes a CMOS inverter formed of PMOS 712 and NMOS 714, each of which receive a signal to be transmitted from a host device 742, on input line 702. Host device 742 may be one or more computer processors configured to communicate with device 740 using a host controller comprising transmission output circuit 700. PGATE circuit 704 converts the signal to be transmitted from a host device 742 to a PGATE signal, such that when the signal to be transmitted on input line 702 is logic low, a PGATE logic high is created by turning on PMOS 712 and turning off NMOS 716. When PMOS 712 is on, line 520 carrying a PGATE signal is pulled high to 710, which in embodiments is coupled to the transmit high supply voltage 504. When NMOS 714 is on, line 520 carrying PGATE is pulled low to 716, which in embodiments is coupled to a bias voltage line, e.g. via pad 402, carrying a bias voltage, e.g. 440b.

NGATE circuit 706, by way of example, includes a CMOS inverter formed of PMOS 722 and NMOS 724, each of which receive a signal to be transmitted from a host device 742, on input line 702. NGATE circuit 706 converts the signal to be transmitted from a host device 742 to an NGATE signal, such that when the signal to be transmitted

TABLE 2

| PAD (502) | Gate PM1 (524) | VDS(PM1) | GatePM2 (522) | VDS(PM2) | GatePM3 (520) | VDS(PM3) |
|---|---|---|---|---|---|---|
| 3.3 V | 1.8 V | 0 | 1.8 V | 0 | 1.8 V | 0 |
| 0 | 0 | 0.7 V | 1.8 V | 1.8 V | 3.3 V | 0.8 V |

| GateNM1 (544) | VDS(NM1) | GateNM2 (542) | VDS(NM2) | GateNM3 (540) | VDS(NM3) |
|---|---|---|---|---|---|
| 3.3 V | 0.7 V | 1.8 V | 1.5 V | 0 | 1.1 V |
| 1.8 V | 0 | 1.8 V | 0 | 1.8 V | 0 |

FIGS. 6a, 6b, and 6c illustrate the various states 602, 604, 606 of bias generation circuit 320 in accordance with Table 1 above. In state 602, transistors 422 and 424 are off, and a bias current path 610 opens between highest bias voltage VHbias 404 and an output transmission circuit 306, which in embodiments includes output transmission circuit 500. In state 604, transistors 420 and 424 are off, and a bias current path 612 opens between bias voltage 406 and an output transmission circuit 306, which in embodiments includes output transmission circuit 500. In state 606, transistors 420 and 422 are off, and a bias current path 614 opens between bias voltage 408 and an output transmission circuit 306, which in embodiments includes output transmission circuit 500. Where output transmission circuit 306 includes output on input line 702 is logic low, an NGATE logic high is created by turning on PMOS 722 and turning off NMOS 716. When PMOS 722 is on, line 540 carrying an NGATE signal is pulled high to 720, which in embodiments is coupled to the highest bias voltage, e.g. VHbias 404b. When NMOS 724 is on, line 540 carrying NGATE is pulled low to 726, which in embodiments is coupled to a transmit low supply voltage, e.g. 508.

Figure 8:
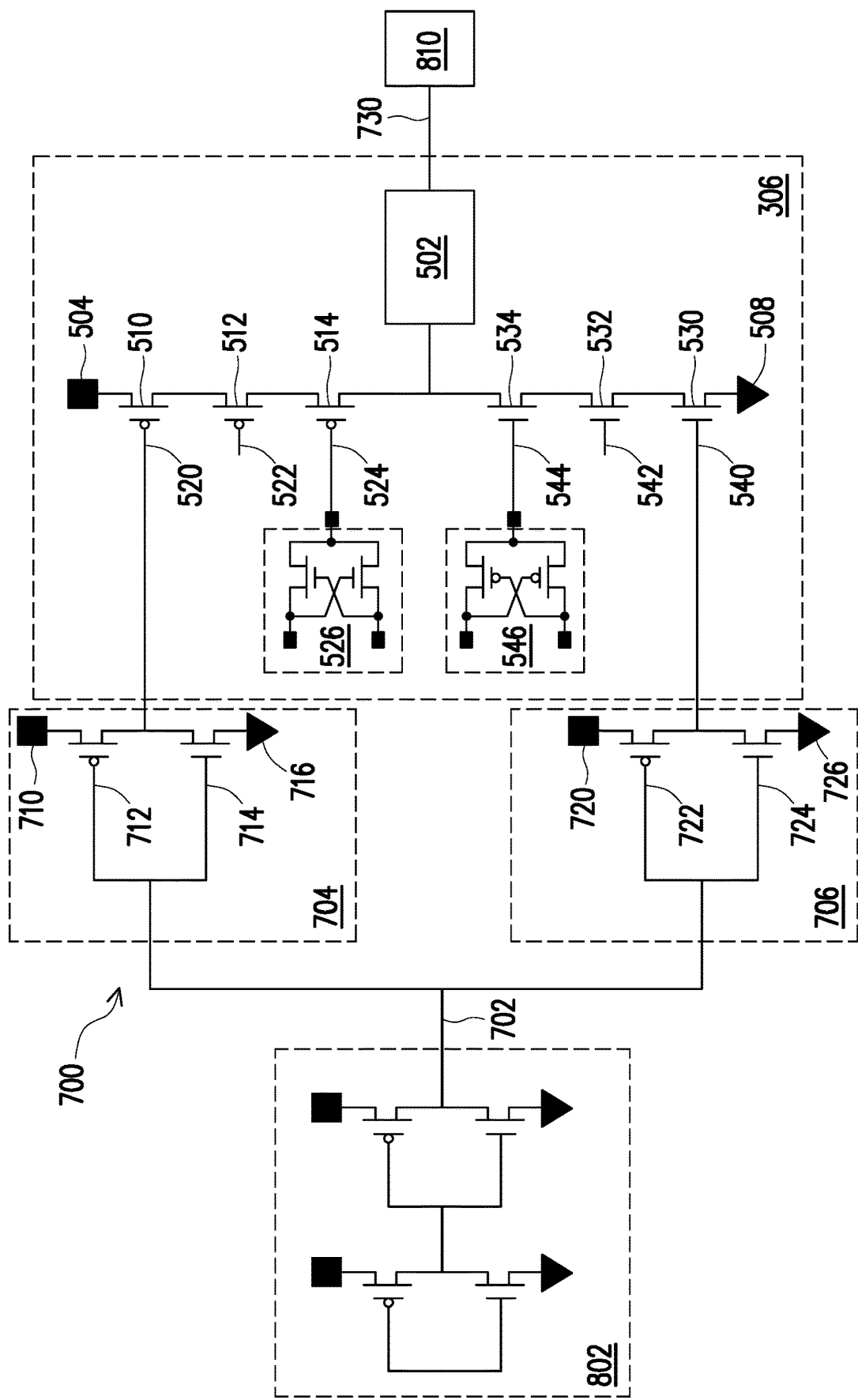
FIG. 8 illustrates aspects of a three stage signaling component of a semiconductor device in accordance with various embodiments.

FIG. 8 illustrates embodiments of a transmission output circuit 700 a signal to be transmitted on line 702 to device 810 according to a desired protocol. The signal to be transmitted is provided to line 702 by buffer 802, depicted here for example as a string of an even number of inverters. It will be appreciated that any buffer may serve as buffer 802.

Figure 9:
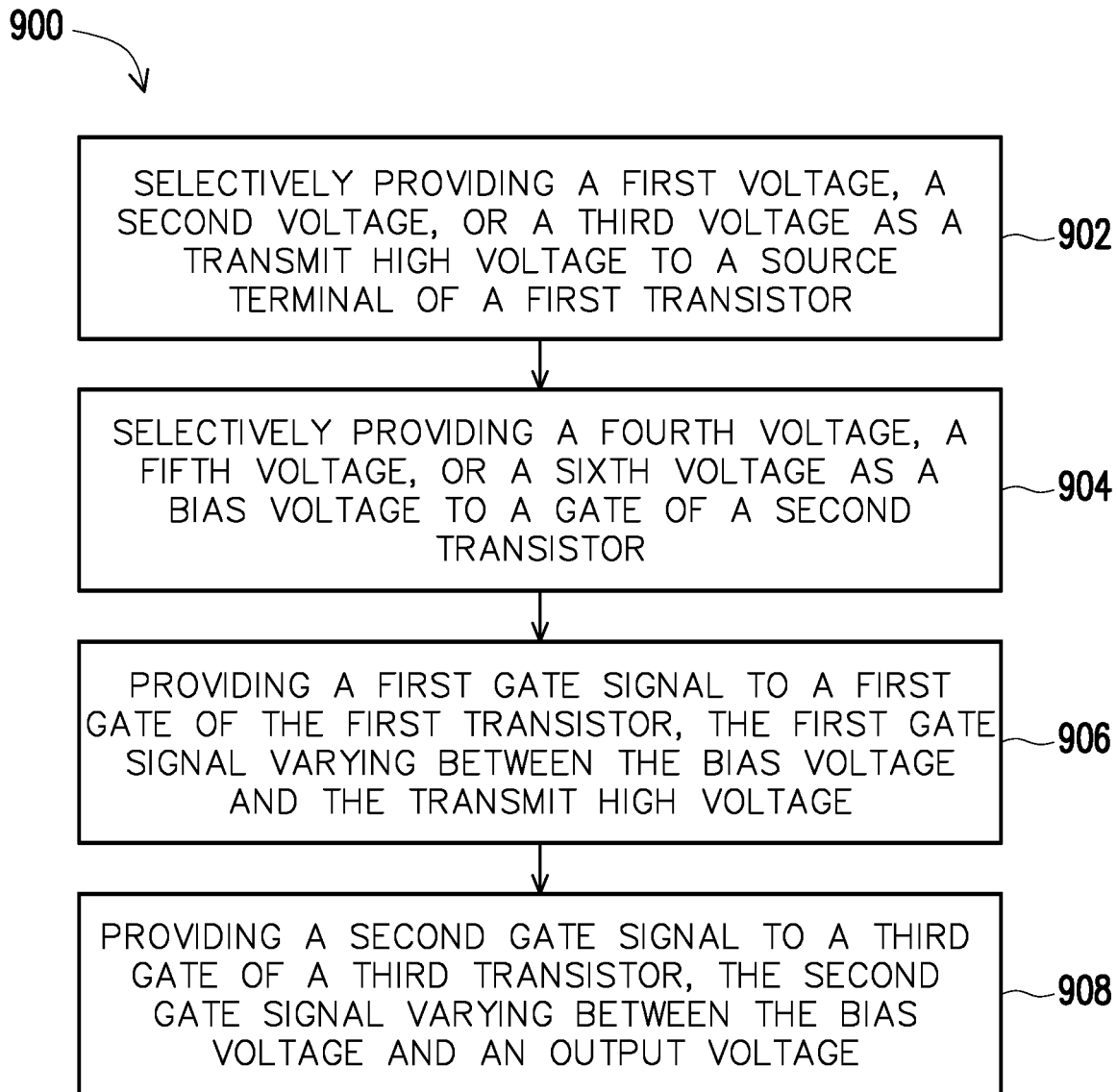
FIG. 9 is a flow chart illustrating aspects of methods in accordance with various embodiments.

FIG. 9 illustrates a flow chart for performing a method 900 in accordance with various embodiments. Signaling method 900 illustrated in FIG. 9 includes a step 902 of selectively providing a first voltage, a second voltage, or a third voltage as a transmit high voltage to a source terminal of a first transistor. And signaling method 900 includes a step 904 of selectively providing a fourth voltage, a fifth voltage, or a sixth voltage as a bias voltage to a gate of a second transistor. Signaling method 900 also includes a step 906 of providing a first gate signal to a first gate of the first transistor such that the first gate signal varies between the bias voltage and the transmit voltage. As used herein a signal varies between a voltage A and a voltage B means that from time to time it takes voltage A and from time to time it alternatively takes voltage B and from time to time it transitions between a voltage A and a voltage B (or visa versa), during which transition the signal momentarily takes voltages between voltage A and voltage B.

In embodiments, method 900 is a method of signaling using a multivoltage transmitter in accordance with various embodiments. The transmit voltage considered in step 906 may be an output voltage appearing at an output pad in series with the first transistor, the second transistor and the third transistor. In embodiments, the first voltage may be 3.3 volts, the second voltage may be 2.5 volts, the third voltage may be 1.8 volts, and the fourth voltage is 1.8 volts, the fifth voltage is 0.8 volts, and the sixth voltage is 0 volts. But, these voltages are only offered by way of example, and any suitable voltages fulfilling the needs of a wider circuit design or application will suffice, within the constraint that none of the transistors of the device are operated in excess of their maximum rated voltage when transmitting at the highest any desired transmit voltage as contemplated in step 906. In some embodiments, a maximum rated voltage for the transistors contemplated by step 902 is 1.98 volts. In embodiments, a maximum desired (or target) operational voltage for the transistors contemplated in step 902 is 1.8 volts.

Figure 10:
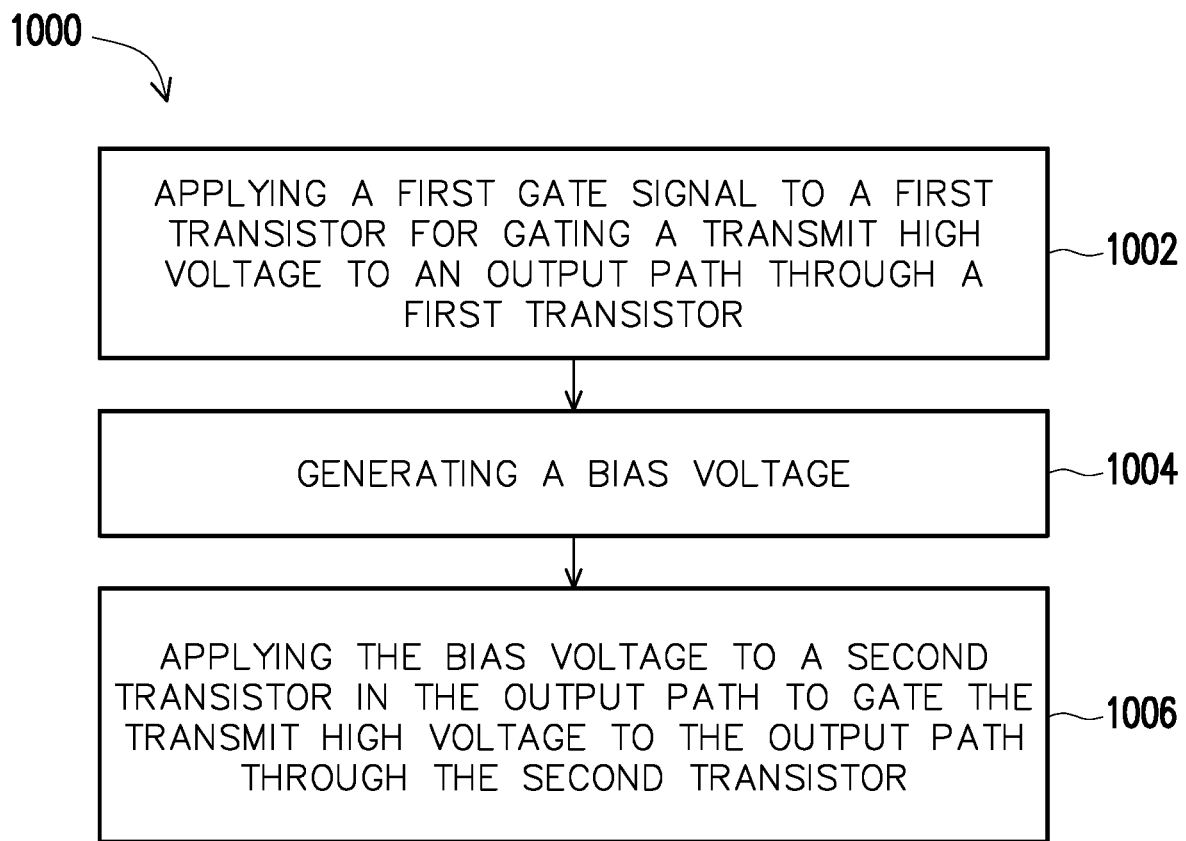
FIG. 10 is a flow chart illustrating aspects of methods in accordance with various embodiments.

FIG. 10 illustrates a flow chart for performing a method 1000 according to various embodiments. Method 1000 includes a step 1002 of applying a first gate signal to a first transistor for gating a transmit high voltage to an output path through a first transistor. Method 1000 also includes a step 1004 of generating a bias voltage, that has a magnitude less than the magnitude of the transmit high voltage. The transmit high voltage less the bias voltage is less than a maximum operational voltage of a transistor in the output path. A bias voltage less a transmit low voltage are also less in magnitude than a maximum operational voltage of a transistor in the output path. And at step 1006, the bias voltage is applied to a transistor gate of a transistor in the output path.

In exemplary embodiments, in transistors contemplated by method 1000 a maximum operational voltage is 1.98 volts. In other embodiments the maximum operational voltages may be more or less as dictated by the fabrication process employed or by the materials or material sources employed during fabrication. In other embodiments, the maximum operational voltage may be significantly higher, e.g. in power electronics applications. In some embodiments, each device may also include finFET devices.

As provided herein, embodiments of a semiconductor device have a pull up network. The pull-up network includes a first transistor having a first gate coupled to a first bias voltage. The pull-up network has a second transistor that has a second gate coupled to a first gate signal. The first gate signal varies between the first bias voltage and a first source voltage. The pull up transistor network is configured such that, when the first gate signal approaches the first voltage, the first transistor is on and the second transistor is on and an output voltage at an output is approximately the first source voltage.

In interrelated embodiments, a semiconductor device for signaling at an output includes a variable power source. The variable power source selectively provides a first voltage as a high output voltage, a second voltage as the high output voltage, or a third voltage as the high output voltage. The devices also includes a first transistor having a first gate coupled to a first gate signal. The first gate signal varies between a bias voltage and the high output voltage. The device includes a second transistor having a second gate coupled to a bias voltage line. The bias voltage line provides the bias voltage. The device also includes a third transistor that has a third gate coupled to a first tracking circuit. The first tracking circuit is configured to provide a first varying voltage to the third gate. The first varying voltage varying between the bias voltage and an output voltage present at the output. The first, second and third transistors are coupled in series between the output and the variable power source such that when the first gate signal has a magnitude near the bias voltage, the first transistor is on and the output voltage approaches the high output voltage.

In interrelated embodiments, a method of transmitting a signal includes applying a first gate signal to a first transistor gate for gating a transmit high voltage to an output path through source and drain terminals of a first transistor. And the method includes generating a bias voltage having a magnitude less than the transmit high voltage such that both: (i) a first difference between the transmit high voltage and the bias voltage and (ii) a second difference between the bias voltage and a transmit low voltage are less than he maximum rated voltage of a second transistor having source and drain terminals in the output path. The method also includes applying the bias voltage to a second transistor gate of the second transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

This written description and the following claims may include terms, such as "on," that are used for descriptive purposes only and are not to be construed as limiting. The embodiments of a S/H circuit, or device or circuit including such a S/H circuit described herein, can be manufactured, used, or shipped in a number of configurations.

What is claimed is:

1. A semiconductor device having a pull up network comprising:
   a first transistor having a first gate coupled to a first bias voltage;
   a second transistor having a second gate coupled to a first gate signal that varies between the first bias voltage and a first source voltage; and
   a switch network responsive to an input control signal for selectably providing as the first bias voltage one of a plurality of available voltages, the switch network having a buffer that is responsive to the input control signal for selectively providing as the first bias voltage one of a second bias voltage, a second source voltage, and a third voltage between the second bias voltage and the second source voltage.

2. The semiconductor device of claim 1 having a pull down network including:
a third transistor having a third gate coupled to the second bias voltage; and
a fourth transistor having a fourth gate coupled to a second gate signal that varies between the second source voltage and the second bias voltage, wherein the pull up network is configured such that, when the first gate signal takes the first source voltage, the second transistor takes the second bias voltage, and the third transistor is on and the fourth transistor is on and the output voltage is the second source voltage.

3. The semiconductor device of claim 2, wherein:
the first source voltage is nominally 3.3 volts, the second source voltage is nominally 0.0 volts, and both the first bias voltage and the second bias voltage are nominally 1.8 volts; or
wherein the first source voltage is nominally 2.5 volts, the second source voltage is nominally 0.0 volts, and the first bias voltage is nominally 0.8 volts and the second bias voltage is nominally 1.8 volts; or
wherein the first source voltage is nominally 1.8 volts, the second source voltage is nominally 0.0 volts, and the first bias voltage is nominally 0.0 volts, and the second bias voltage is nominally 1.8 volts.

4. The semiconductor device of claim 1, wherein the pull up network is configured such that, when the first gate signal takes the first bias voltage, the first transistor is on.

5. The semiconductor device of claim 1, wherein the first and second transistors are p-type finFET and the third and fourth transistors are n-type finFETs each having a same nominal maximum voltage.

6. The semiconductor device of claim 5, wherein the nominal maximum voltage is 1.98 volts.

7. A semiconductor device for signaling at an output comprising:
a first tracking circuit, wherein the first tracking circuit is configured to provide
a first varying voltage, the first varying voltage varying between a bias voltage and an output voltage present at an output, further wherein first, second and third transistors are coupled in series between the output and a variable power source such that when a first gate signal takes the bias voltage the first transistor is on and the output voltage takes high output voltage;
a transmission circuit capable of transmitting a transmission signal comprising the high output voltage and a low output voltage and having a plurality of different configurations; and
a buffer selectively providing an input signal to one of the plurality of different configurations of the transmission circuit;
wherein:
the first gate signal and the second gate signal are derived from the input signal.

8. The semiconductor device of claim 7, further comprising a bias voltage generator including:
a first switch coupled between a first bias voltage and the bias voltage line;
a second switch coupled between a second bias voltage and the bias voltage line;
a third switch coupled between a third bias voltage and the bias voltage line; and a control circuit for selectively closing one or more of the first switch, the second switch and the third switch, thereby providing one of the first bias voltage, the second bias voltage, or the third bias voltage to the bias voltage line as the bias voltage.

9. The semiconductor device of claim 8, further comprising a second power source providing a low output voltage;
a fourth transistor having a fourth gate coupled to a second tracking circuit;
a fifth transistor having a fifth gate coupled to the first bias voltage;
a sixth transistor having a sixth gate coupled to a second gate signal that varies between the low output voltage and the first bias voltage, wherein the second tracking circuit is configured to provide a second varying voltage to the fourth gate, the second varying voltage varying between the first bias voltage and the output voltage, further wherein the fourth, fifth, and sixth transistors are coupled in series between the output and the second power source, such that when the first gate signal takes the high output voltage the first transistor is off, the second gate signal takes first bias voltage, and the output voltage takes the low output voltage.

10. The semiconductor device of claim 9, wherein:
the first voltage is nominally 3.3 volts, the second voltage is nominally 2.5 volts, the third voltage is nominally 1.8 volts, the low output voltage is nominally 0.0 volts, the first bias voltage is nominally 1.8 volts, the second bias voltage is nominally 0.8 volts and, and the third bias voltage is nominally 0.0 volts; and further wherein, when the variable power supply is selectively providing the first voltage, the first switch is closed thereby providing the first bias voltage to the bias voltage line and the bias voltage is the first bias voltage.

11. The semiconductor device of claim 7, wherein at least one of the first, second, third, fourth, fifth, or sixth transistors is a finFETs having a VMAX less than the high output voltage.

12. The semiconductor device of claim 11, wherein the finFET is formed by a 7 nm, 10 nm, or 16 nm process.

13. The semiconductor device of claim 7, wherein a transistor gate pitch between any two transistors of the semiconductor device is 56 nanometers or less and an interconnection pitch between any two interconnection lines of the device is 40 nanometers or less.

14. The semiconductor device of claim 7 further comprising a transmission circuit, the transmission circuit being capable of transmitting a transmission signal, the transmission signal comprising the high output voltage and the low output voltage, the transmission circuit comprising a buffer, the buffer being configured for providing an input signal, wherein the first gate signal and the second gate signal are derived from the input signal, wherein the transmission signal varies with the output voltage at the output.

15. The semiconductor device of claim 14, wherein the transmission circuit is a member of a system on a chip.

16. A method of transmitting a signal, comprising:
applying a first gate signal to a first transistor gate for gating a transmit high voltage to an output path through source and drain terminals of a first transistor;
generating a bias voltage using a switch network having a buffer that is responsive to an input control signal for selectively providing as the bias voltage one of a second bias voltage, a second source voltage, and a third voltage between the second bias voltage and the second source voltage and selectively applying the bias voltage to a second transistor gate of the second transistor.

17. The method of claim 16, wherein the second transistor is formed from one of a 7 nm, a 10 nm, or a 16 nm process.

18. The method of claim 17, further comprising selectively applying, as the transmit high voltage, 1.8 volts nominal, 2.5 volts nominal, or 3.3 volts nominal to the source or drain terminal of the first transistor, the first transistor and the second transistor being fin-type field effect transistors (finFET).

19. The method of claim 16, wherein the maximum rated voltage of the second transistor is nominally 1.98 volts.

20. The method of claim 19, wherein when applying nominal 1.8 volts as the transmit high voltage, the generated bias voltage is nominally 0 volts; and when applying nominal 2.5 volts as the transmit high voltage, the generated bias voltage is nominally 0.8 volts; and when applying nominal 3.3 volts as the transmit high voltage, the generated bias voltage is nominally 1.8 volts.

\* \* \* \* \*